(12) United States Patent
Lee

(10) Patent No.: US 10,327,338 B2
(45) Date of Patent: *Jun. 18, 2019

(54) METHOD FOR COATING A DEVICE AND DEVICES HAVING NANOFILM THEREON

(71) Applicant: Nanoshield Technology Co., Ltd., Taipei (TW)

(72) Inventor: James Cheng Lee, Diamond Bar, CA (US)

(73) Assignee: Nanoshield Technology Co., Ltd., Taipei (TW)

( * ) Notice: Subject to any disclaimer, the term of this patent is extended or adjusted under 35 U.S.C. 154(b) by 0 days.

This patent is subject to a terminal disclaimer.

(21) Appl. No.: 15/342,722

(22) Filed: Nov. 3, 2016

(65) Prior Publication Data

US 2017/0367193 A1 Dec. 21, 2017

Related U.S. Application Data

(60) Provisional application No. 62/351,590, filed on Jun. 17, 2016, provisional application No. 62/357,550, (Continued)

(51) Int. Cl.
| | |
|---|---|
| *C09D 7/61* | (2018.01) |
| *H05K 3/28* | (2006.01) |
| *H05K 1/03* | (2006.01) |
| *H05K 1/18* | (2006.01) |
| *C09D 7/40* | (2018.01) |

(52) U.S. Cl.
CPC ............... *H05K 3/285* (2013.01); *C09D 7/61* (2018.01); *C09D 7/67* (2018.01); *C09D 7/68* (2018.01);
(Continued)

(58) Field of Classification Search
USPC .................................................. 361/748, 760
See application file for complete search history.

(56) References Cited

U.S. PATENT DOCUMENTS 8,148,830 B2* 4/2012 Bedinger ............ H01L 23/3192
257/790
2006/0275611 A1 12/2006 Nishimura
(Continued)

FOREIGN PATENT DOCUMENTS

| CN | 101733028 A | 6/2010 |
|---|---|---|
| EP | 2604364 A1 | 6/2013 |

(Continued)

OTHER PUBLICATIONS

Extended European Search Report issued in connection with corresponding European patent application No. 17153614.7, dated Nov. 6, 2017, 15 pages.
(Continued)

*Primary Examiner* — Andargie M Aychillhum
(74) *Attorney, Agent, or Firm* — Duane Morris LLP

(57) ABSTRACT

A device includes a printed circuit board assembly having a printed circuit board and one or more electronic components disposed on the printed circuit board, and a nanofilm disposed on the printed circuit board assembly. The nanofilm includes an inner coating in contact with the printed circuit board assembly, the inner coating including metal oxide nanoparticles having a particle diameter in a range of 5 nm to 100 nm; and an outer coating in contact with the inner coating, the outer coating including silicon dioxide nanoparticles having a particle diameter in a range of 0.1 nm to 10 nm.

11 Claims, 23 Drawing Sheets

Related U.S. Application Data filed on Jul. 1, 2016, provisional application No. 62/367,838, filed on Jul. 28, 2016.

(52) U.S. Cl.
CPC ........... *H05K 1/0306* (2013.01); *H05K 1/181* (2013.01); *H05K 2201/0175* (2013.01); *H05K 2201/0179* (2013.01); *H05K 2201/0191* (2013.01); *H05K 2201/0195* (2013.01); *H05K 2201/0257* (2013.01); *H05K 2201/1003* (2013.01); *H05K 2201/10015* (2013.01); *H05K 2201/10022* (2013.01); *H05K 2201/10166* (2013.01); *H05K 2201/10174* (2013.01); *H05K 2201/10189* (2013.01); *H05K 2203/1105* (2013.01); *H05K 2203/1333* (2013.01)

(56) References Cited

U.S. PATENT DOCUMENTS

| | | |
|---|---|---|
| 2007/0295389 A1 | 12/2007 | Capps et al. |
| 2008/0248263 A1* | 10/2008 | Kobrin ................... C08J 7/16 428/195.1 |
| 2009/0192255 A1 | 7/2009 | Lin et al. |
| 2012/0040577 A1 | 2/2012 | Kissel et al. |
| 2012/0202047 A1 | 9/2012 | Welch et al. |
| 2014/0078422 A1 | 3/2014 | Tanabe et al. |
| 2016/0024313 A1 | 1/2016 | Boday et al. |

FOREIGN PATENT DOCUMENTS

| | | |
|---|---|---|
| WO | 2012/047691 A2 | 4/2012 |
| WO | 2012/125247 A1 | 9/2012 |

OTHER PUBLICATIONS

Extended European Search Report issued in connection with European patent application No. 17176251.1, dated Nov. 20, 2017, 7 pages.

European Search Report issued in connection with corresponding European patent application No. 17153614.7, dated Jul. 5, 2017, 12 pages.

* cited by examiner

METHOD FOR COATING A DEVICE AND DEVICES HAVING NANOFILM THEREON

CROSS-REFERENCE TO RELATED APPLICATIONS

The present application is based upon and claims priority to provisional application Nos. 62/351,590 filed Jun. 17, 2016, 62/357,550 filed Jul. 1, 2016, and 62/367,838 filed Jul. 28, 2016, the entire contents of all of which are incorporated herein by reference.

FIELD OF THE INVENTION

The present invention generally relates to a method for fabricating a nanofilm, and more particularly to a method for coating a device with a nanofilm to protect the device from being corroded and moistened.

THE RELATED ART

As electronic devices continue to shrink in size and grow in capacity, the importance of corrosion control increases. Miniaturization of systems based on integrated circuits and small size electronic components, close component spacing, separable electrical contacts having lower voltages and contact force than before have resulted in failures of electrical components because of the formation of small quantities of metal corrosion. Therefore, it is important to find a method for fabricating electronic devices with a superhydrophobic nanofilm coating. This technique can protect the device surface from being corroded and moistened by some exterior chemicals, and extend the operating life of the device. In addition, some other engineering systems such as aircraft, automobiles, pipelines, and naval vessels also need a protective nanofilm keeping them from being corroded and moistened and providing less friction.

It is known that the surface properties, such as morphology, roughness, and composition can affect the surface wetting characteristics, spanning the range from superhydrophilic to superhydrophobic. The superhydrophobic film is formed by the deposition of larger sized nanoparticles followed by smaller sized nanoparticles. This surface structure shows high surface roughness that enables the trapping of air under water droplets, thereby exhibiting the well-known rolling water droplet effect that is characteristic of a superhydrophobic surface. Many different techniques used to fabricate a device with superhydrophobic nanofilms, including sol-gel techniques, plasma-enhanced chemical vapor deposition (PECVD), and physical vapor deposition (PVD). For the sol-gel coating technique, solutions containing differently sized nanoparticles are used to create a hydrophobic film containing a mixture of micro- and nano-scale nanoparticles which can prevent water from penetrating the device surface. However, it is difficult to control the aggregation and dispersion behavior of nanoparticles in solutions, resulting in thick films with low roughness. For the PVD or PECVD techniques, the substrates are introduced to a vacuum chamber to first create a suitably micrometer-scale textured film on substrate surface that is subsequently deposited with nanometer-scale particles at a very low speed. The benefits of using PVD or PECVD techniques to grow hydrophobic materials onto a substrate are the quality of resultant surface structure which is usually very high. However, the most limiting factor in the development of PVD or PECVD techniques has been their cost. The high production cost for fabricating a device with superhydrophobic film has been an obstacle to compete with other techniques. Moreover, the precursor gases used in the fabrication process are usually very toxic and need to be removed by extreme levels of heat, which may damage the electronic device. Therefore, a method for forming a superhydrophobic film with high quality surface structure and low cost for electronic devices is required.

SUMMARY OF THE INVENTION

An object of the present invention is to provide a method for preparing the first solution metal oxide nanoparticles. The method includes steps of: adding metal powders and distilled water into a serum bottle; adjusting the pH value of the mixed solution in the range of 6.5-9.5 by adding acidic solvents such as $HNO_3$, HF, $H_2SO_4$ or HCl, neutral solvents such as IPA, Acetone or Alcohol, and alkaline solvents such as NaOH, KOH, or $NH_4OH$; and heating the mixed solution under vigorous stirring at an appropriate temperature and time, for example, at about 50 degree to 150 degree Celsius for 10-20 hours. The mixed solution has metal oxide nanoparticles having a size distribution of several to hundreds of nanometers, such as about 5 nm to about 100 nm, at room temperature, and is hydrophilic and transparent.

An object of the present invention is to provide a method for preparing a second solution having silicon dioxide nanoparticles. The method includes steps of: adding silica powders and distilled water into a serum bottle; adjusting the pH value of the mixed solution in the range of 6.5-9.5 by adding acidic solvents such as $HNO_3$, HF, $H_2SO_4$ or HCl, organic solvents such as IPA, Acetone or Alcohol, and alkaline solvents such as NaOH, KOH, or $NH_4OH$; adding organic solvents such as n-Hexane, n-Heptane, n-octane, n-dodecane, n-tetradecane, or n-hexadecane into the mixed solution; adding the metallic materials such as Fe, Cr, Mn, or Mo as the catalysts into the mixed solution; heating the mixed solution under vigorous stirring at an appropriate temperature and time, for example, at about 50 degree to 150 degree Celsius for 1-10 hours forming a two-layer mixed solution where smaller-scale silicon dioxide nanoparticles existing in the top-layer mixed solution; and extracting the top layer of the mixed solution as the second solution. The silicon oxide solution includes silicon dioxide nanoparticles having the size distribution of 1 angstrom to tens of nanometers, such as 0.1 nm to 50 nm at room temperature; and is transparent, hydrophobic, and low volatile.

An object of the present invention is to provide a method for fabricating an electronic device with a transparent superhydrophobic nanofilm coating. The method includes steps of: cleaning the electronic device; baking the device at an appropriate temperature and time, for example, at about 50 degree to 150 degree for 10-30 minutes; applying a first solution with metal oxide nanoparticles as a first solute on the electronic device by any means known in the art, such as spraying, dipping, roll coating, brushing, and the like, the size of the metal oxide nanoparticles being from several to hundreds of nanometers, such as from about 5 nm to about 100 nm; baking the electronic device coated with the first solution at an appropriate temperature and time, for example, at about 50 degree to 150 degree for 10-30 minutes to form an inner coating on the electronic device with the metal oxide nanoparticles and strengthening adhesive force between the inner coating and the electronic device; applying a second solution having silicon dioxide nanoparticles as a second solute on the inner coating, the size of silicon dioxide nanoparticles being from 1 angstrom to tens of nanometers, such as 0.1 nm to 50 nm; and baking the electronic device coated with the second solution at an appropriate temperature and time, for example, at about 50 degree to 150 degree for 10-30 minutes to form as an outer coating on the inner coating with the silicon dioxide nanoparticles and strengthening adhesive force between the inner coating and outer coating.

Another object of the present invention is provide a method for coating a printed circuit board assembly (PCBA), which includes steps of: cleaning the PCBA surface; baking the PCBA at an appropriate temperature and time, for example, at about 50 degree to 150 degree for 10-30 minutes; applying a first solution with metal oxide nanoparticles as a first solute on the PCBA by any means known in the art, such as spraying, dipping, roll coating, brushing, and the like, the size of the metal oxide nanoparticles being from several to hundreds of nanometers, such as from about 5 nm to about 100 nm; baking the PCBA coated with the first solution at an appropriate temperature and time, for example, at about 50 degree to 150 degree for 10-30 minutes to form an inner coating on the PCBA with the metal oxide nanoparticles and strengthening adhesive force between the inner coating and the PCBA; applying a second solution having silicon dioxide nanoparticles as a second solute on the inner coating, the size of silicon dioxide nanoparticles being from 1 angstrom to tens of nanometers, such as 0.1 nm to 50 nm; and baking the PCBA coated with the second solution at an appropriate temperature and time, for example, at about 50 degree to 150 degree for 10-30 minutes to form an outer coating on the inner coating with the silicon dioxide nanoparticles and strengthening adhesive force between the inner coating and outer coating.

A thickness of the nanofilm coated on the device can be from few nanometers to few microns, such as from 10 nm to 1 micron. The nanofilm may be composed of the titanium dioxide nanoparticles and the silicon dioxide nanoparticles. The diameter of silicon dioxide nanoparticles is smaller than that of titanium dioxide nanoparticles. The nanofilm consisting of larger titanium dioxide nanoparticles and smaller silicon dioxide nanoparticles exhibits hierarchical structure and high surface roughness, leading to the superhydrophobic property. The water contact angle $\theta$ of the nanofilm on the device surface is in the range of $90°<\theta<150°$. In some embodiments, the nanofilm can make the device surface have less friction or other functions.

In another aspect, an object of the present invention is to provide a PCBA with nanofilm coating which has a waterproof function and a corrosion-resisting function. The PCBA with nanofilm coating includes a printed circuit board assembly and a nanofilm. The printed circuit board assembly includes a printed circuit board and a plurality of electronic components mounted onto the surface of the printed circuit board. The nanofilm has a composition of metal oxide nanoparticles having a size of about 5 nm to 100 nm and silicon dioxide nanoparticles having a size of about 0.1 nm to 50 nm. The larger-sized metal oxide nanoparticles form an inner coating on the surface of the PCBA whereas the smaller-sized silicon dioxide nanoparticles are decorated on the inner coating to form the outer coating to prevent water from penetrating the PCBA surface.

As described above, the nanofilm in the present invention is composed of larger-sized metal oxide nanoparticles and smaller-sized silicon dioxide nanoparticles, which can protect the PCBA from being corroded and moistened. The nanofilm allows the device it protected to have a good waterproof and corrosion resistance characteristics.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion. Like reference numerals denote like features throughout specification and drawings.

DETAILED DESCRIPTION OF THE PREFERRED EMBODIMENTS

Figure 1:
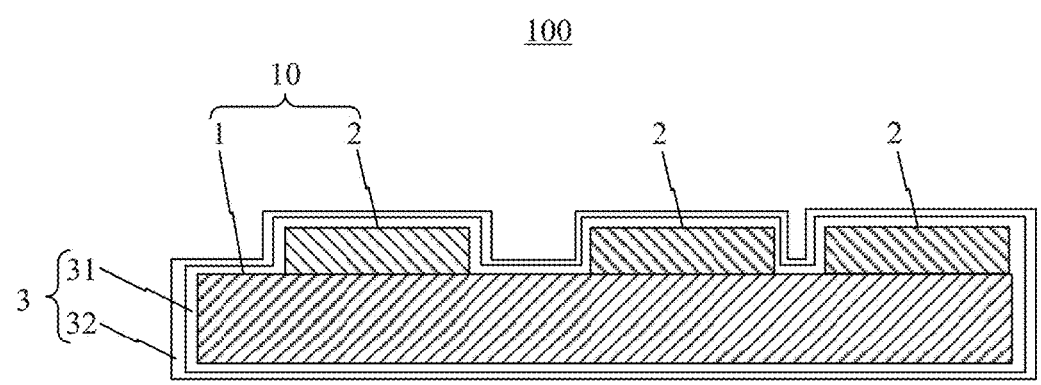
FIG. 1 is a schematic diagram of an electronic device having a printed circuit board assembly (PCBA) coated with a nanofilm in accordance with some embodiments of the present invention.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the present disclosure the singular forms "a," "an," and "the" include the plural reference, and reference to a particular numerical value includes at least that particular value, unless the context clearly indicates otherwise. Thus, for example, a reference to "a PCBA" is a reference to one or more of such structures and equivalents thereof known to those skilled in the art, and so forth. When values are expressed as approximations, by use of the antecedent "about," it will be understood that the particular value forms another embodiment. As used herein, "about X" (where X is a numerical value) preferably refers to ±10% of the recited value, inclusive. For example, the phrase "about 8" preferably refers to a value of 7.2 to 8.8, inclusive; as another example, the phrase "about 8%" preferably (but not always) refers to a value of 7.2% to 8.8%, inclusive. Where present, all ranges are inclusive and combinable. For example, when a range of "1 to 5" is recited, the recited range should be construed as including ranges "1 to 4", "1 to 3", "1-2", "1-2 & 4-5", "1-3 & 5", "2-5", and the like. In addition, when a list of alternatives is positively provided, such listing can be interpreted to mean that any of the alternatives may be excluded, e.g., by a negative limitation in the claims. For example, when a range of "1 to 5" is recited, the recited range may be construed as including situations whereby any of 1, 2, 3, 4, or 5 are negatively excluded; thus, a recitation of "1 to 5" may be construed as "1 and 3-5, but not 2", or simply "wherein 2 is not included." It is intended that any component, element, attribute, or step that is positively recited herein may be explicitly excluded in the claims, whether such components, elements, attributes, or steps are listed as alternatives or whether they are recited in isolation.

Unless expressly indicated otherwise, references to "metal oxide" made below will be understood to encompass any suitable oxide of any suitable metal. Examples of suitable metal oxides include but are not limited to the oxides of a metal (or a combination thereof) selected from the following groups: (1) Al, Ga, In, Sn, Tl, Pb, and Bi ("poor metals"); (2) the first series of transition metals (first d block series) including Sc, Ti, V, Cr, Mn, Fe, Co, Ni, Cu, and Zn; (3) the second series of transition metals (second d block series) including Y, Zr, Nb, Mo, Tc, Ru, Rh, Pd, Ag, and Cd; and (4) the third series of transition metals (third d block series) including Lu, Hf, Ta, W, Re, Os, Ir, Pt, Au, and Hg. More preferably, the metal for the metal oxides is selected from at least one of Al, Ti, Cr, Mn, Co, Zn, Mo, Rh, Pd, Ag, W and Au. For example, a suitable titanium dioxide $TiO_2$ in some embodiments.

FIG. 1 illustrates a schematic diagram of an exemplary electronic device 100, according to some embodiments. The electronic device 100 includes a printed circuit board assembly (PCBA) 10 and a nanofilm 3 coated on the PCBA 10. The PCBA 10 includes a printed circuit board (PCB) 1, one or more electronic components 2 mounted thereon. The peripheries and surfaces of the PCB 1 and the electronic components 2 are rough. In manufacturing process of the PCBA 10 and the electronic components 2, a plurality of pores, gaps and other structures which make the PCBA 10 and the electronic components 2 rough are formed. The nanofilm 3 includes, for example, metal oxide nanoparticles and silicon dioxide nanoparticles having a size smaller than the metal oxide nanoparticles. The nanofilm 3 includes an inner coating 31 and an outer coating 32. The inner coating 31 includes the metal oxide nanoparticles formed on the PCB 1 and the electronic components 2 of the PCBA 10. The outer coating 32 includes the silicon dioxide nanoparticles formed on the inner coating 31.

The shapes of the inner coating 31, the outer coating 32, and the PCBA 10 shown on FIG. 1 are merely schematic. In some embodiments, the periphery of the inner coating 31 has a plurality of tiny pores, gaps and other structures. When the outer coating 32 is formed on the inner coating 31, there may be interpenetration between the outer coating 32 and the inner coating 31. In some embodiments, the outer coating 32 and the inner coating 31 may not be two separate layers. In general, the particle size increases as it is disposed closer to the surface of the PCBA 10. In some embodiments, the inner coating 31 may interpenetrates into the pores, gaps and other structures of the PCBA 10. The metal oxide nanoparticles of the inner coating 31 have diameters in the range of from about 5 nm to about 100 nm. The silicon dioxide nanoparticles of the outer coating 32 have diameters in the range of from about 0.1 nm to about 10 nm. The electronic components 2 can be a resistor, a capacitor, an inductor, a transistor, a diode, a connector, a speaker, a microphone and any other components which can be mounted on the PCB 1. The PCBA 10 may be employed in a pack battery, a headset, a phone or any other electronic devices. The PCB 1 is made from a FR-4 composite material in some embodiments.

In some embodiments, the nanofilm 3 is coated onto the PCBA 10 by volatilization or pyrolysis of a metal oxide nanoparticle solution and a silicon dioxide nanoparticle solution.

In some embodiments, the metal oxide nanoparticle solution includes a mixture of the metal oxide nanoparticles and a solvent. The metal oxide nanoparticle solution has a concentration in the range from 0.3% to 5%. The solvent may be selected from one of water, methanol, ethanol, and the like or any combination thereof. In some embodiments, the metal oxide nanoparticle solution is hydrophilic and transparent.

In some embodiments, the silicon dioxide nanoparticle solution includes a mixture of the silicon dioxide nanoparticles and a solvent. The silicon dioxide nanoparticle solution has a concentration in the range from 0.3% to 5%. The solvent composition includes heptane, cetane, methyl hydrogen siloxane, the like or any combination thereof. In some embodiments, the silicon dioxide nanoparticle solution is transparent, hydrophobic, and low volatile.

With the help of the solvent, the nanoparticles can be uniformly distributed on the PCB 1 and the electronic components 2, to avoid the agglomeration of the nanoparticles and increase the contacting area of the nanoparticles. The nanofilm 3 can be formed with high compactness, uniformity, and small thickness on the PCBA 10.

The electronic components 2 can be a resistor, a capacitor, an inductor, a transistor, a diode, a connector, a speaker, a microphone and any other components which can be mounted on the PCB 1. The PCBA 10 may be applied in a pack battery, a headset, a phone, or any other electronic devices. The PCB 1 may be made from a FR-4 composite material in some embodiments.

Figure 2:
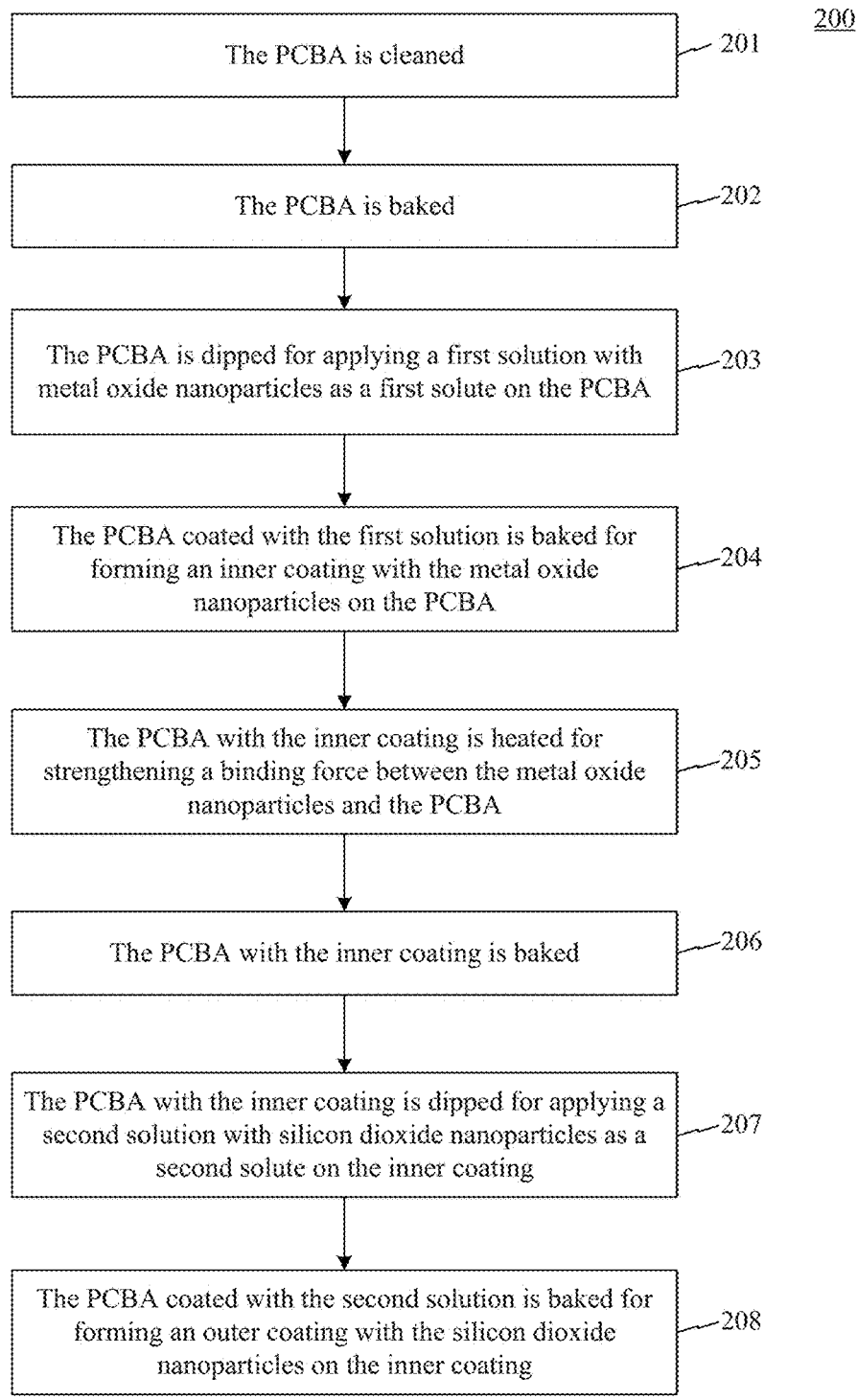
FIG. 2 is a flow chart showing a method for coating a PCBA in accordance with some embodiments of the present invention.

FIG. 2 is a flow chart showing an exemplary method 200 for coating the PCBA 10 with metal oxide nanoparticles and silicon dioxide nanoparticles, according to some embodiments. The PCBA 10 may be placed on a loader (not shown) to execute later steps. The PCBA 10 is cleaned for removing soldering flux residue formed in manufacturing process (step 201). In some embodiments, the PCBA 10 is cleaned with pure water at about 40 degree to 60 degree Celsius for 10-30 minutes in an ultrasonic cleaning machine. The PCBA 10 is baked (step 202), which can dry the PCBA 10 and expose pores, gaps and other structures of the PCBA 10. In some embodiments, the PCBA 10 is baked at about 50 degree to 150 degree Celsius for 10-30 minutes in a baking equipment (not shown). A first solution including metal oxide nanoparticles as a first solute and a first solvent is applied on the PCBA 10 (step 203). In some embodiments, the PCBA 10 may be dipped in, spayed with or brushed with the first solution or other possible ways for applying the first solution on the PCBA 10. The metal oxide nanoparticles have diameters in the range of about 5 nm and about 100 nm. In some embodiments, the concentration range of the first solution is from 0.3% to 5%.

The PCBA 10 with the first solution distributed thereon is baked for removing the solvent and leaving the metal oxide nanoparticles on the PCBA 10 to form an inner coating 31 by at least one of volatilization and pyrolysis of a first solvent of the first solution (step 204). In some embodiments, the PCBA 10 with the first solution is baked at about 50 degree to 150 degree Celsius for 5-30 minutes in a baking equipment (not shown). The first solvent is one of water, methanol or ethanol, which can help the metal oxide nanoparticles more uniformly distributed on the PCBA 10. The PCBA 10 with the inner coating 31 is unloaded from the loader. The PCBA 10 with the inner coating 31 is heated for strengthening a binding force between the metal oxide nanoparticles and the PCBA (step 205). In some embodiments, the PCBA 10 coated with the inner coating 31 is heated at about 25 degree to 100 degree for 2-72 hours. Other ways the skilled artisan may use for strengthening the binding force between the metal oxide nanoparticles and the PCBA 10 should fall in the present invention. After being heated, the PCBA 10 with the inner coating 31 is placed in a loader (not shown).

The PCBA 10 with the inner coating 31 is baked (step 206), which can expose pores, gaps, and other structures of the inner coating 31. In some embodiments, the PCBA 10 with the inner coating 31 is baked at about 50 degree to 150 degree Celsius for 10-30 minutes in a baking equipment (not shown). In some embodiments, after the binding force between the metal oxide nanoparticles and the PCBA 10 is strengthened, before the PCBA 10 with the inner coating 31 is baked, a step of checking the appearance of the PCBA 10 coated with the inner coating 31 and cleaning the PCBA with the inner coating 31 is included.

A second solution with silicon dioxide nanoparticles as a second solute is applied on the inner coating 31 (step 207). The second solution includes the silicon dioxide nanoparticles and a second solvent. The silicon dioxide nanoparticles have diameters in the range of from about 0.1 nm to about 10 nm. In some embodiments, the PCBA 10 coated with the metal oxide nanoparticles may be dipped in, spayed with, or brushed with the second solution or subjected to other ways for applying the second solution on the inner coating 31. The second solvent of the second solution includes one of heptane, cetane, or methyl hydrogen siloxane, or a combination thereof. The second solvent can help the silicon dioxide nanoparticles more uniformly distributed on the inner coating 31. The PCBA 10 with the second solution is baked for removing the second solvent and leaving the silicon dioxide nanoparticles on the inner coating 31 as an outer coating 32 (step 208). In some embodiments, the PCBA 10 with the second solution is baked at about 50 degree to 150 degree Celsius for 10-30 minutes in a baking equipment (not shown). Then the appearance and the function of the PCBA 10 with nanofilm 3 are checked.

In some embodiments, one or more components of electronic device 100 may not need to be covered by nanofilm 3. For example, when the PCBA 10 includes a speaker, a microphone, a switch or other components, the speaker, the microphone, or the switch needs to be exposed. Thus, when applying the first solution and the second solution on the PCBA 10, these components need to be masked. In some embodiments, the microphone and the switch may be masked before the PCBA 10 is cleaned in step 201 because a diaphragm of the microphone and the switch need to be kept from touching water or other liquid. In some embodiments, the switch may be masked before the second solution applied on the inner coating in step 207 because the second solution with the silicon dioxide nanoparticles will affect the function of the switch. For example, the switch may be masked before the second solution applied on the inner coating 31 in step 207 and after the binding force between the metal oxide nanoparticles and the PCBA is strengthened in step 205. As another example, the switch may be masked before PCBA 10 with the inner coating 31 is baked in step 206 and after the binding force between the metal oxide nanoparticles and the PCBA is strengthened in step 205. A masking material on these components may be removed after the outer coating 32 is formed.

In the present disclosure, all the temperature values are in Celsius scale. The percentages in the formulations are in weight percent (wt. %) even though volume percentages in the similar ranges are also acceptable.

In some embodiments, the silicon dioxide nanoparticles may be silica particles, which are amorphous and hydrophobic. The silica particles (e.g., fumed silica) are obtained from a supplier, without any chemical modification. These particles provide desirable hydrophobicity in a coated surface. The silica particles may be chemically modified in some other embodiments.

Silica particles used may have some hydroxyl (—OH) groups on the surface. These hydroxyl groups may react with a hydroxyl group on a surface of a substrate and/or metal oxide nanoparticles, and promote formation of covalent bonds to improve coating adhesion.

In the solution or suspension containing nanoparticles, a surfactant or dispersant may be used in some embodiments.

A thickness of nanofilm 3 is less than 200 nm in some embodiments. For example, the coating thickness may be in the range of from 5 nm to 100 nm, from 10 nm to 20 nm, or in other suitable ranges depending on usage of the electronic device 100.

Figure 3A:
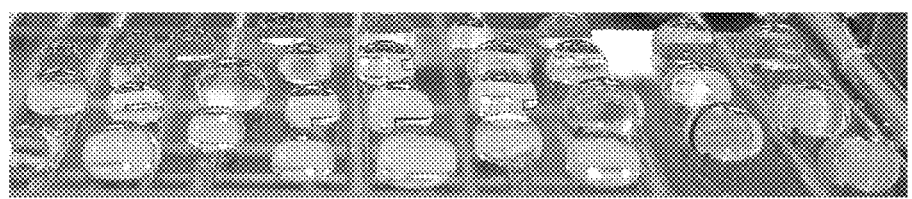
FIG. 3A is a picture of water droplets formed on a glass substrate coated with a nanofilm consistent with embodiments of the present disclosure.
Figure 3B:
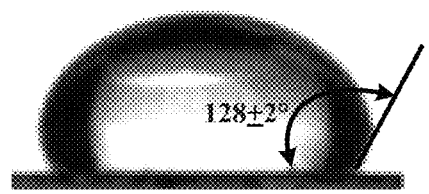
FIG. 3B is a close-look view of a tiny water droplet on a glass substrate coated with a nanofilm.

FIG. 3A is a picture of water droplets formed on a glass substrate coated with a nanofilm consistent with embodiments of the present disclosure. As shown in FIG. 3A, because of the superhydrophobic effect of the nanofilm 3, the water on the glass substrate coated with the nanofilm is dispersed to form tiny water droplets. FIG. 3B is a close-look of a tiny water droplet. A contact angle θ between the water droplet and the glass substrate coated with the nanofilm is 128±2°. Generally, θ≥90°, or θ≥110°, or θ≥130°, or 150≥θ≥110°, or 150≥θ≥90°.

EXAMPLES

Figure 4:
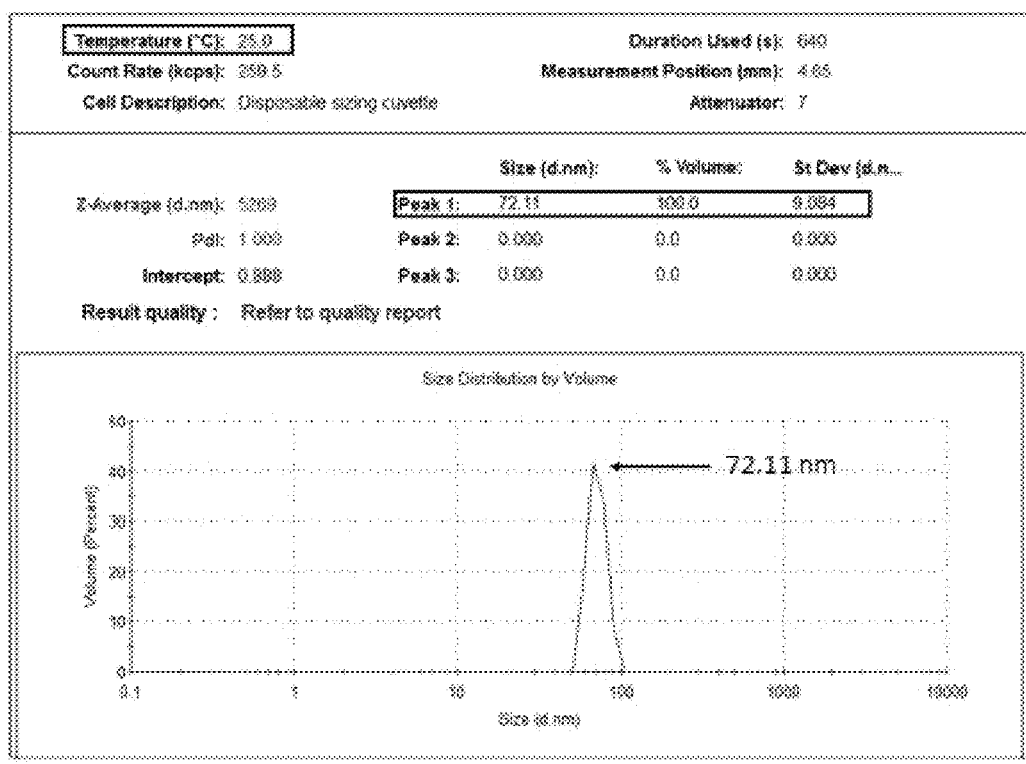
FIG. 4 illustrates measurement results of a particle size distribution of $TiO_2$ nanoparticles by a dynamic light scattering method at room temperature.
Figure 5:
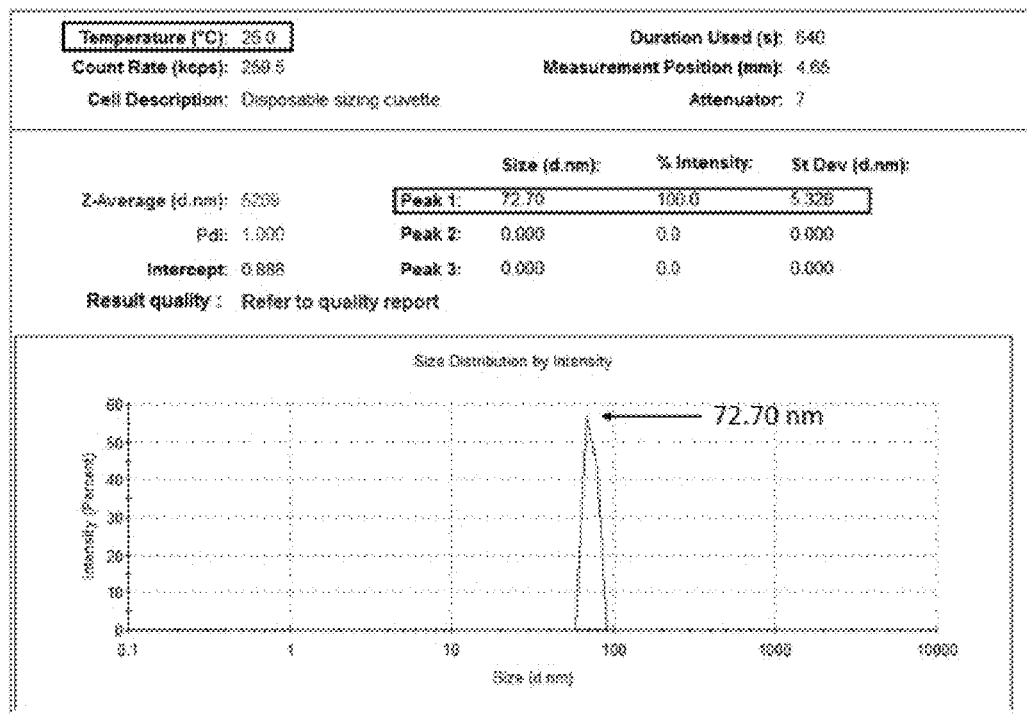
FIG. 5 illustrates another measurement results of a particle size distribution of $TiO_2$ nanoparticles by a dynamic light scattering method at room temperature.
Figure 6:
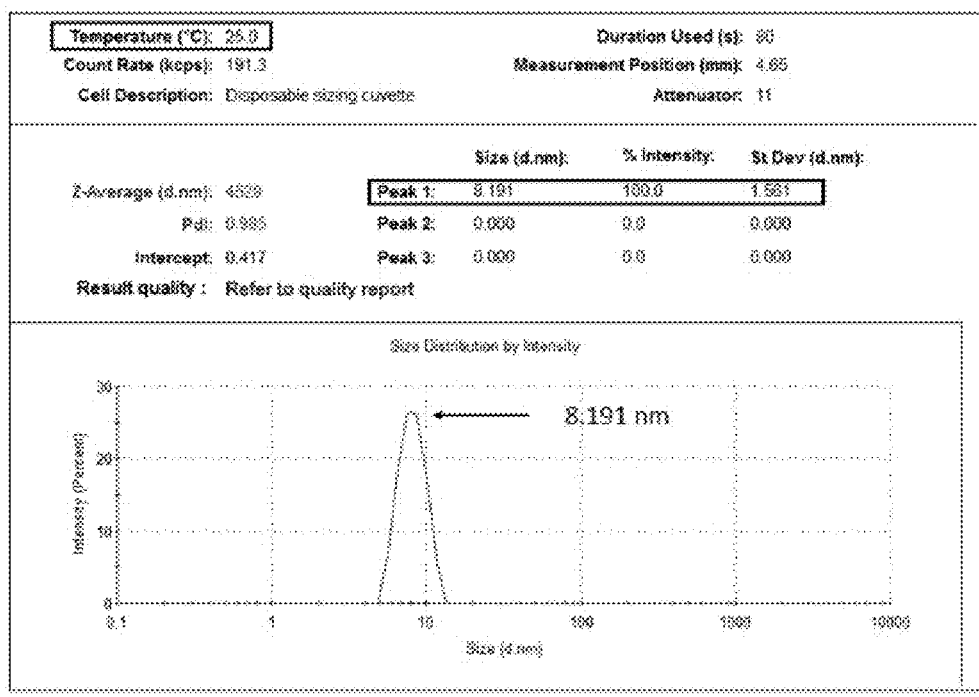
FIG. 6 illustrates yet another measurement results of a particle size distribution of $TiO_2$ nanoparticles by a dynamic light scattering method at room temperature.
Figure 7:
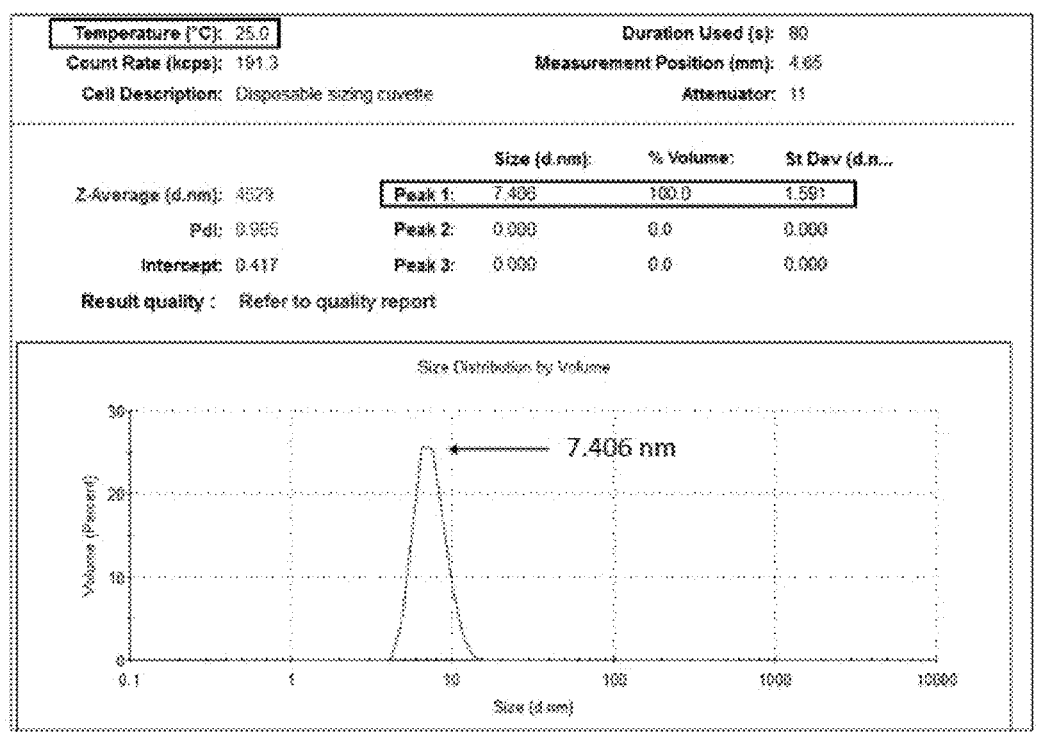
FIG. 7 illustrates another measurement results of a particle size distribution of $TiO_2$ nanoparticles by a dynamic light scattering method at room temperature.

Nanofilm coatings may be formed using the following two solutions (or mixtures or suspensions). A first solution includes $TiO_2$ nanoparticles having a particle size in the range from about 5 nm to about 100 nm dispersed in pure water. The content of $TiO_2$ nanoparticles in the first solution is in the range from about 0.8 wt. % to about 1.5 wt. %. The first solution has a density of 1.01 g/cm³. Exemplary particle size distribution data of the first solution are shown in FIGS. 4-7. FIG. 4 shows that a first solution has 100% $TiO_2$ nanoparticles having a diameter of 72.11 nm at room temperature. FIG. 5 shows that a first solution has 100% $TiO_2$ nanoparticles having a diameter of 72.70 nm at room temperature. FIG. 6 shows that a first solution has 100% $TiO_2$ nanoparticles having a diameter of 8.191 nm at room temperature. FIG. 7 shows that a first solution has 100% $TiO_2$ nanoparticles having a diameter of 7.406 nm at room temperature.

Figure 8:
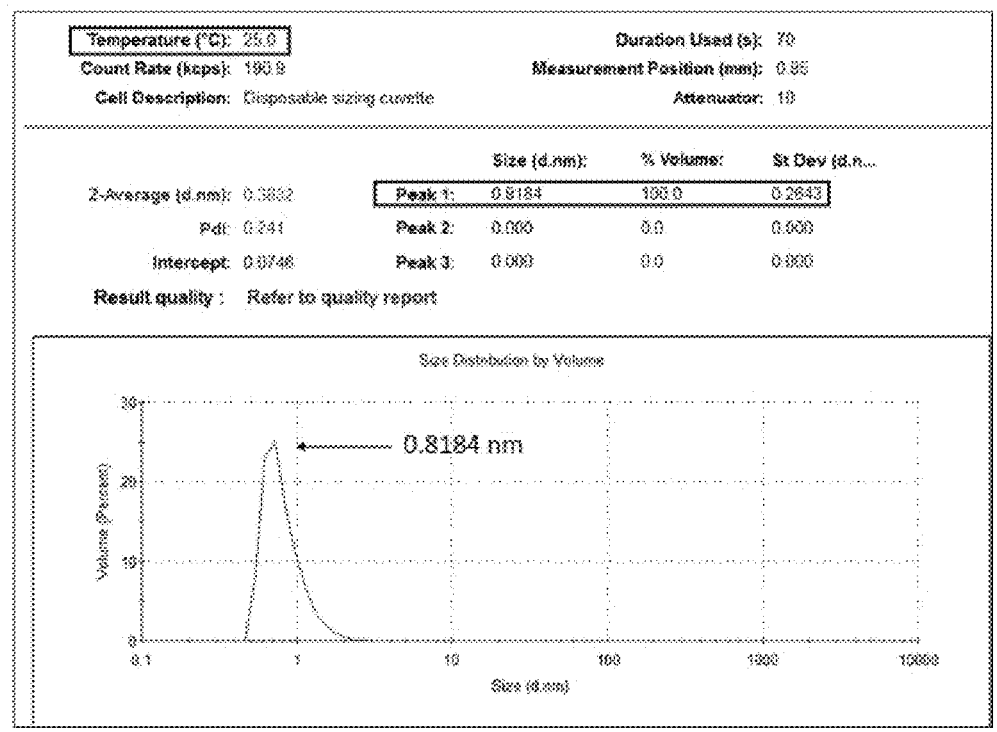
FIG. 8 illustrates measurement results of a particle size distribution of $SiO_2$ nanoparticles by a dynamic light scattering method at room temperature.
Figure 9:
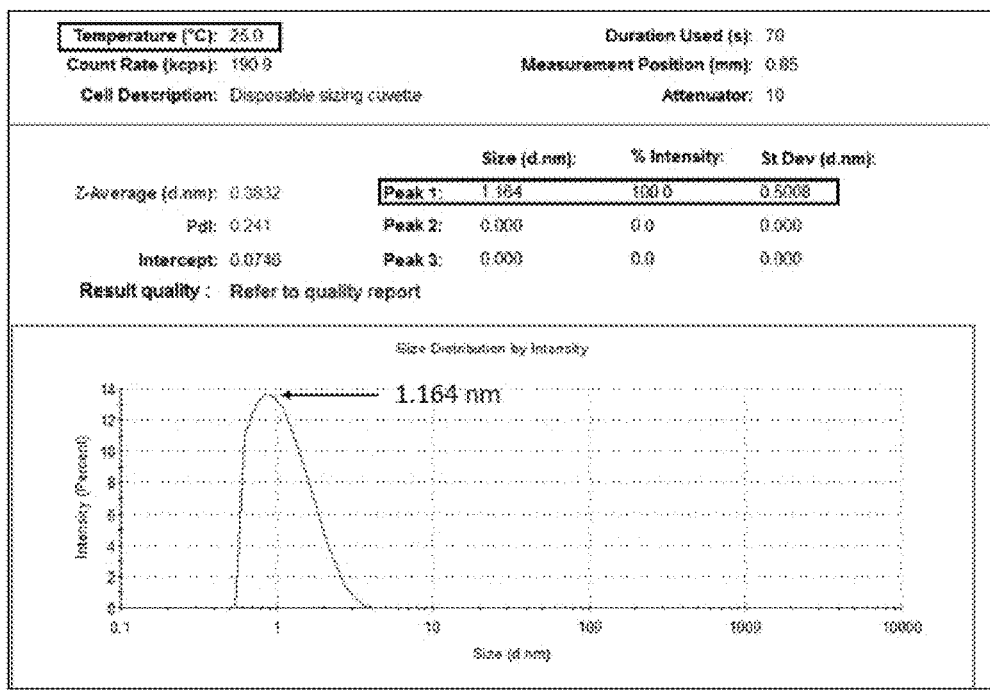
FIG. 9 illustrates another measurement results of a particle size distribution of $SiO_2$ nanoparticles by a dynamic light scattering method at room temperature.
Figure 10:
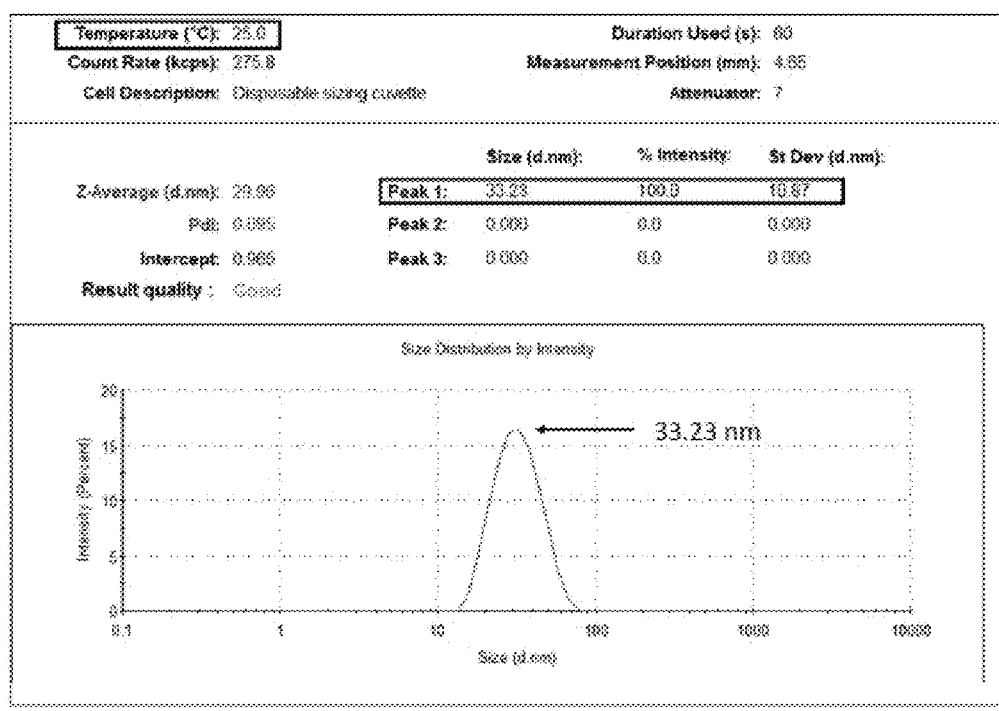
FIG. 10 illustrates yet another measurement results of a particle size distribution of $SiO_2$ nanoparticles by a dynamic light scattering method at room temperature.
Figure 11:
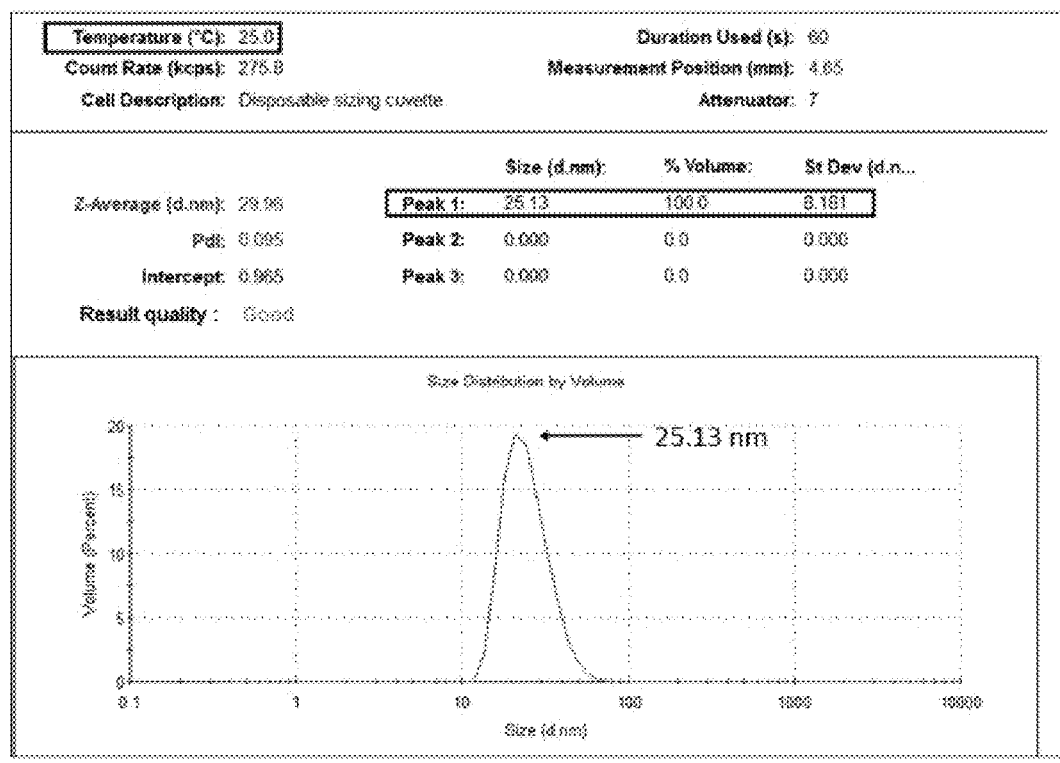
FIG. 11 illustrates another measurement results of a particle size distribution of $SiO_2$ nanoparticles by a dynamic light scattering method at room temperature.

A second solution includes $SiO_2$ nanoparticles having a particle size in the range from about 5 nm to about 100 nm dispersed in heptane and hexadecane. The second solution may also contain methyl hydrogen polysiloxane (about 0.1-5 wt. %). The content of $SiO_2$ nanoparticles in the second solution is in the range from about 0.1 wt. % to about 5 wt. %. The second solution has a density of 0.774 g/cm³. Exemplary particle size distribution data of the second solution are shown in FIGS. 8-11. FIG. 8 shows that a second solution has 100% $SiO_2$ nanoparticles having a diameter of 0.8184 nm at room temperature. FIG. 9 shows that a second solution has 100% $SiO_2$ nanoparticles having a diameter of 1.164 nm at room temperature. FIG. 10 shows that a second solution has 100% $SiO_2$ nanoparticles having a diameter of 33.23 nm at room temperature. FIG. 11 shows that a second solution has 100% $SiO_2$ nanoparticles having a diameter of 25.13 nm at room temperature.

For example, in one exemplary process, a PCBA was cleaned with a solvent and dried at 60° C. for 10 minutes. The cleaned PCBA was immersed in the first solution for about 5-10 seconds, followed by a baking at 150° C. for 5 minutes and at 50° C. for 8 hours. After preheated at 80° C. for 10 minutes, the PCBA was immersed in the second solution for 5-10 seconds. The PCBA was then baked at 100° C. for 20 minutes.

Hereinafter, the performance of a PCBA with nanofilm in some embodiments of the present invention will be explained with reference to test results.

Corrosion-Resistance Test I

In this test, a PCBA with a nanofilm is compared with a PCBA with a conventional film formed by vapor deposition of the prior art technology. The thickness of the film formed by vapor deposition is difficult to control. It is found that as the thickness of the film by vapor deposition increase, its protective effect is improved, but the performance of the PCBA becomes worse. In this test, a thickness range of the film formed by vapor deposition is between 3 μm to 5 μm. The test procedures are described as following: drip a sweat on each electronic component of both test PCBA products every 5 min for one hour, and put both the test products into the 40° C. environment to dry the electronic components. Each of the above procedures is repeated twice a day. After completing the above-mentioned procedures, the electronic components are tested every day. The above testing steps are repeated until all of the electronic components of the both test PCBA products are not working/functioning. The test result is shown in Table 1, a corrosion rate of the PCBA with a film formed by vapor deposition is faster than that of the PCBA with the nanofilm consistent with the disclosure of the present invention. As a result, the nanofilm in this embodiment has better corrosion-resistance property.

TABLE 1

| | Number of Non-Functioning Components | | | | | | | |
|---|---|---|---|---|---|---|---|---|
| Test sample | Day 1 | Day 2 | Day 3 | Day 4 | Day 5 | Day 6 | Day 7 | Day 8 |
| PCBA coated with nanofilm | 0 pcs | 2 pcs | 2 pcs | 4 pcs | 4 pcs | 4 pcs | 7 pcs | 8 pcs |
| PCBA coated with a film formed by vapor deposition | 1 pcs | 2 pcs | 3 pcs | 4 pcs | 5 pcs | | | |

Corrosion-Resisting Test II

Another corrosion-resisting test is used to test the chemical durability of the nanofilm. In this test, a PCBA coated with a nanofilm connects to a plug thereon. The test procedure is described as following: the PCBA coated with the nanofilm and the plug are dipped into the artificial sweat and then taken out; the plug is connected with a receptacle for charging for one hour. The PCBA coated with the nanofilm and the plug are dipped in the artificial sweat again after charging. The dipping and charging actions are repeated for 200 times. The charging current, charging voltage, and charging indicator are observed until the charging action fails. The test result is shown in Table 2, the PCBA coated with nanofilm and the plug are not affected by sweat and can be used in a range of criteria.

TABLE 2

| | Function check item | | |
|---|---|---|---|
| | Charging voltage | Charging current | Indicator light |
| Result | Under spec | Under spec | normal |

Water Proof Test I

Two earphones are used to test a waterproof function of a PCBA coated with a nanofilm of the present invention. Each of the earphones has a PCBA with a nanofilm. The test procedure is described as following: put the earphones under the water and record the play time under the water until the earphones stop working. The test result is shown in Table 3, the average working time under the water is 207.5 min. The waterproof function of the PCBA with the nanofilm is improved with an acceptable protection of electronic components of the earphones.

TABLE 3

| Sample No. | Time (min) | Avg. (min) |
|---|---|---|
| Sample #1 | 199 | 207.5 |
| Sample #2 | 216 | |

Water Proof Test II

In this test, a PCBA coated with a nanofilm is connected with a battery pack. The test procedure is described as following: put the battery pack and the PCBA with the nanofilm under the water for 30 min and observe the working condition of the battery pack. The test result is shown in Table 4 below. the battery pack connecting with the PCBA with nanofilm can work normally under the water.

TABLE 4

| | Check Item | | |
|---|---|---|---|
| | Visual Inspection of Battery Module | Electric function Test | Reliability Test |
| Battery Pack Samples | PASS | PASS | PASS |

Resistance Measured Test

In order to confirm whether the nanofilm affects the surface resistance of the PCBA or not, the test measures the surface resistance of a PCBA before and after it is coated with a nanofilm. The test result is shown in Table 5 and confirms that the nanofilm substantially has no effect on the surface resistance of the PCBA. The difference of the surface resistance of the PCBA before and after it is coated with the nanofilm is within 1%.

TABLE 5

| | Resistance (Avg.) | |
|---|---|---|
| Before | 82.103 Ω | 92.413 Ω |
| After | 82.356 Ω | 92.473 Ω |
| Difference | 0.253 Ω | 0.06 Ω |
| | (0.31%) | (0.06%) |

Current Measurement Test

In order to confirm whether the nanofilm affects the surface current of the PCBA or not, the test measures the surface currents of four test points in a PCBA before and after it is coated with a nanofilm. The test result is shown in Table 6. The nanofilm substantially has no effect on the surface current of the PCBA. The difference of the surface currents of the PCBA before and after it is coated with the nanofilm is within 1%.

TABLE 6

| | Current | | | |
|---|---|---|---|---|
| Test Point | 1 | 2 | 3 | 4 |
| Before | 59.047 μA | 210.299 μA | 218.795 μA | 15.159 mA |
| After | 59.505 μA | 209.821 μA | 219.1 μA | 15.197 mA |
| Difference | 0.458 μA | −0.478 μA | 0.305 μA | 0.038 mA |
| | (0.78%) | (−0.23%) | (0.14%) | (0.25%) |

The process of coating a nanofilm consistent with embodiments of the present disclosure can be applied in other devices by a skilled artisan. For example, when a cable is connected with the PCBA, the cable and the PCBA are coated simultaneously. After the coating process, the cable has a good waterproof characteristic, a good corrosion resistance, and a smaller friction. The temperatures and time periods of the above cleaning, baking and heating processes in coating a nanofilm may be modified in accommodation with different devices.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments are chosen and described in order to best explain the principles of the invention and its practical applications, to thereby enable others skilled in the art to best utilize the invention and various embodiments with various modifications as are suited to the particular use contemplated.

In one aspect, the present disclosure provides a method for coating a device. The method comprises the following steps:

cleaning the device;

baking the device;

applying a first solution having metal oxide nanoparticles as a first solute on the device, the metal oxide nanoparticles having diameters in the range of about 5 nm to about 100 nm;

forming an inner coating on the device with the metal oxide nanoparticles by at least one of volatilization or pyrolysis of a first solvent of the first solution;

strengthening a binding force between the metal oxide nanoparticles and the device;

baking the device coated with the inner coating;

applying a second solution having silicon dioxide nanoparticles as a second solute on the inner coating, the silicon dioxide nanoparticles having diameters in the range of about 0.1 nm and about 10 nm; and forming an outer coating with the silicon dioxide nanoparticles on the inner coating by at least one of volatilization or pyrolysis of a second solvent of the second solution.

In some embodiments, the first solution is applied on the device by dipping, spraying, or brushing. The second solution is applied on the device by dipping, spraying, or brushing. In some embodiments, one of volatilization and pyrolysis of the first solvent of the first solution includes a baking treatment that is applied to the device coated with the first solution. One of volatilization and pyrolysis of the second solvent of the second solution includes a baking treatment that is applied to the device coated with the second solution. The device may be cleaned in an ultrasonic cleaning machine.

In some embodiments, the method further includes a step of checking the appearance of the device coated with the inner coating and cleaning the device coated with the inner coating after strengthening a binding force between the metal oxide nanoparticles and the device and before baking the device with the inner coating. The binding force between the metal oxide nanoparticles and the device may be strengthened by a heat treatment.

In some embodiments, a concentration of metal oxide nanoparticles in the first solution is about 0.3-5 wt. %. A concentration of silicon dioxide nanoparticles in the second solution is about 0.3-5 wt. %. The first solvent may include one of water, methanol, or ethanol, or a combination thereof. The second solvent may include one of heptane, cetane, or methyl hydrogen siloxane, or a combination thereof.

In some embodiments, the method further includes a step of masking one or more portions of the device before cleaning the device and a step of removing a masking material on the portions of the device after the outer coating is formed. The method may also include a step of masking one or more portions of the device before the step of applying the first solution on the device and the step of baking the device, and a step of removing a masking material on the portions of the device after the outer coating is formed. The method may also include a step of masking one or more portions of the device before the second solution is applied to the device coated with the inner coating and after strengthening a binding force between the metal oxide nanoparticles and the device, and a step of removing a masking material on the portions of the device after the outer coating is formed.

In some embodiments, the present disclosure provides a method for coating a printed circuit board assembly (PCBA), including:

cleaning the PCBA;

baking the PCBA at about 50 degree to 150 degree Celsius for 10-30 minutes;

applying a first solution having metal oxide nanoparticles as a first solute on the PCBA, the metal oxide nanoparticles having diameters in the range of about 5 nm and about 100 nm;

baking the PCBA coated with the first solution at about 50 degree to 150 degree Celsius for 5-30 minutes for forming an inner coating on the PCBA with the metal oxide nanoparticles;

strengthening a binding force between the metal oxide nanoparticles and the PCBA;

baking the PCBA coated with the inner coating at about 50 degree to 150 degree Celsius for 10-30 minutes;

applying a second solution having silicon dioxide nanoparticles as a second solute on the inner coating, the silicon dioxide nanoparticles having diameters in the range of about 0.1 nm and about 10 nm; and baking the PCBA coated with the second solution at about 50 degree to 150 degree Celsius for 10-30 minutes for forming an outer coating on the inner coating with the silicon dioxide nanoparticles.

In some embodiments, the PCBA is cleaned with pure water at about 40 degree to 60 degree Celsius for 10-30 minutes in an ultrasonic cleaning machine. The method may further include a step of checking the appearance of the PCBA coated with the inner coating and cleaning the PCBA coated with the inner coating after strengthening the binding force between the metal oxide nanoparticles and the PCBA and before baking the PCBA with the inner coating. The binding force between the metal oxide nanoparticles and the PCBA can be strengthened by a heat treatment at about 25 degree to 100 degree Celsius for 2 hours to 72 hours. A concentration of the metal oxide nanoparticles in the first solution is about 0.3 wt. %-5 wt. %. A concentration of the silicon dioxide nanoparticles in the second solution is about 0.3 wt. %-5 wt. %. The first solvent is one of water, methanol or ethanol, or a combination thereof. The second solvent is one of heptane, cetane, or methyl hydrogen siloxane, or a combination thereof.

In some embodiments, the method further includes a step of masking one or more portions of the PCBA before cleaning the PCBA and a step of removing a masking material on the portions of the PCBA after the outer coating is formed. The method may further include a step of masking one or more portions of the PCBA before the step of applying the first solution on the device and the step of baking the PCBA and a step of removing a masking material on the portions of the PCBA after the outer coating is formed. The method may further include a step of masking one or more portions of the PCBA before the second solution is applied to the PCBA coated with the inner coating and after strengthening a binding force between the metal oxide nanoparticles and the PCBA, and a step of removing a masking material on the portions of the PCBA after the outer coating is formed.

In another aspect, the present disclosure provides a device including:

a printed circuit board assembly, the printed circuit board assembly including a printed circuit board and one or more electronic components mounted in the printed circuit board; and a nanofilm on the printed circuit board assembly, the nanofilm including an inner coating in contact with the printed circuit board assembly and an outer coating in contact with the inner coating, the inner coating including metal oxide nanoparticles having a particle diameter in a range of 5 nm to 100 nm, and the outer coating including silicon dioxide nanoparticles having a particle diameter in a range of 0.1 nm to 10 nm.

In some embodiments, the nanofilm is formed by volatilization or pyrolysis of a metal oxide nanoparticle solution and a silicon dioxide nanoparticle solution. The metal oxide nanoparticle solution has a concentration range between 0.3 wt. % to 5 wt. %. The silicon dioxide nanoparticle solution has a concentration range between 0.3 wt. % to 5 wt. %. The electronic components may include a resistor, a capacitor, an inductor, a transistor, a diode, a connector, a speaker, a microphone or any other electronic component which is capable of being mounted on the printed circuit board. The printed circuit board is made from a FR-4 composite material in some embodiments.

Although the present disclosure uses a PCBA as example, other substrates, such as metal, glass, plastic substrates, or other electronic devices can be coated with the nanofilm.

Figure 12:
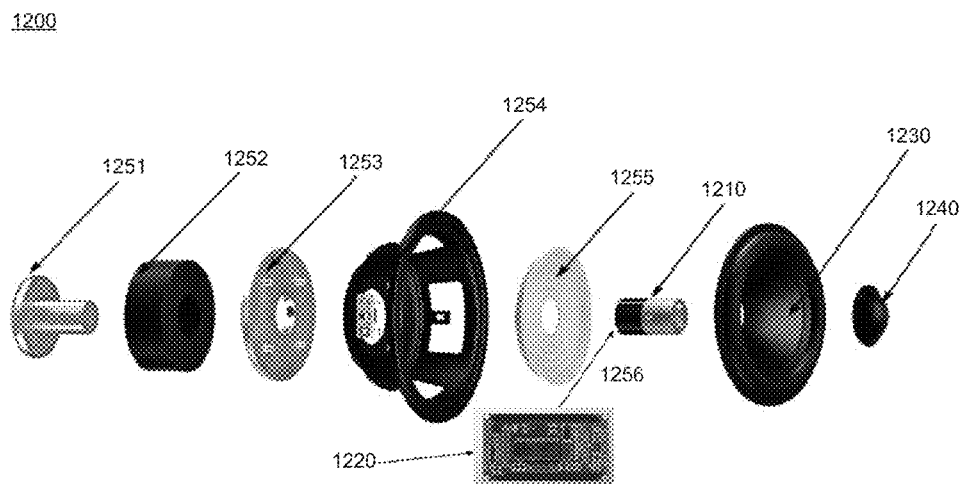
FIG. 12 shows an explosion diagram of an speaker having components coated with nanofilms to have a waterproof function, according to an exemplary embodiment.

FIG. 12 shows an explosion diagram of an speaker 1200 having components coated with nanofilms to have a waterproof function. The speaker 1200 includes a driving unit 1210, a PCBA 1220, a diaphragm 1230, a dustproof mesh 1240 and other elements. The other elements include a yoke 1251, a permanent magnet 1252, a washer 1253, a frame 1254, and damper 1255. The driving unit 110 is electrically connected with the PCBA 120 by a lead wire 156.

The PCBA 1220 has a printed circuit board 1221 and a plurality of electronic components 1222 mounted thereon. The PCBA 1220 is coupled with the driving unit 1210, and the driving unit 1210 drives the diaphragm 1230. The diaphragm 1230 is made of a fibrous material, such as an artificial fiber-like material or leather in some embodiments. The driving unit 1210 can be a moving iron driver, a moving coil driver, an electrostatic driver, or an electric driver. The electronic components 1222 can be a resistor, a capacitor, an inductor, a transistor, or other components, which can be mounted on the printed circuit board 1221. In some embodiments, in order to make the electroacoustic device, i.e., the speaker 1200, be able to emit sounds of a full frequency band, the PCBA 1220 needs to process electric signals, and then convert the electric signals to a plurality of frequency bands. According to design requirements, the plurality of frequency bands are distributed to the driving unit 1210 so that it drives the diaphragm 1230 to vibrate for making sounds.

The PCBA 1220 is coated with a first nanofilm including an inner coating having metal oxide nanoparticles and an outer coating having silicon dioxide nanoparticles, where a size of the metal oxide nanoparticles is greater than a size of the silicon dioxide nanoparticles.

In some embodiments, the surface and periphery of the inner coating has a plurality of tiny pores, gaps, and other structures. When the outer coating is formed on or in the gaps and pores in the inner coating, interpenetration between the outer coating and the inner coating occurs. In some embodiments, the outer coating and the inner coating may not be in a form of two separate layers. In some embodiments, the metal oxide nanoparticles and the silicon dioxide nanoparticles can be in the same layer. The silicon dioxide nanoparticles penetrate into the interstice, e.g., pores or gaps, between the metal oxide nanoparticles. A coating layer comprising both metal oxide and silicon dioxide particles is formed on the PCBA.

The diaphragm 1230 is coated with a second nanofilm. The second nanofilm includes fluoro nanoparticles, e.g., fluoropolymer particles. Examples of fluoropolymer for the fluoro nanoparticles include, but are not limited to, fluoroplastic particles, perfluoropolymers such as polytetrafluoroethylene, perfluoroether, perfluoroester, or perfluoroester-modified siloxane. In some embodiments, the fluoropolymer nanoparticles comprise C—F bonds and/or hydroxyl groups bonded with carbon atoms (e.g., C—OH). For example, fluoro nanoparticles are made of perfluoroether, perfluoroester, or perfluoroether, or perfluoroester-modified siloxane in some embodiments. The particle size (diameter) of such fluoro nanoparticles can be in the range of from 1 nm to 150 nm, from 10 nm to 100 nm, from 50 nm to 100 nm, 72 nm±21 nm average, or from 25 nm to 75 nm, or any combination thereof.

Figure 13:
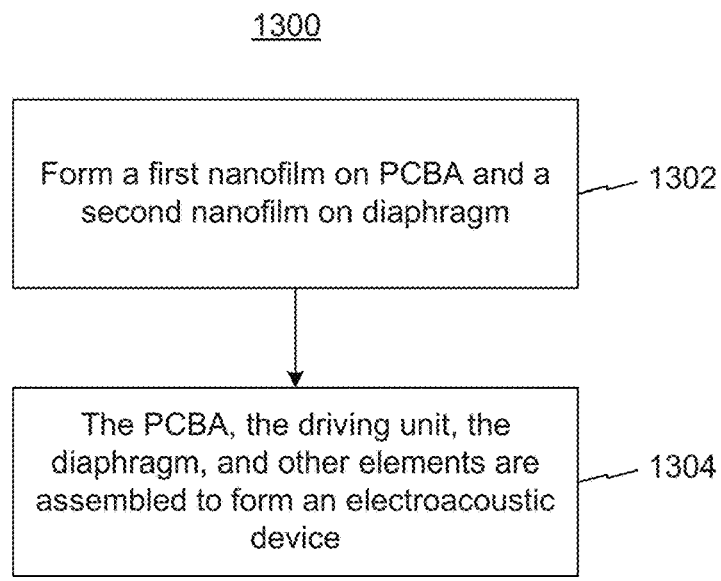
FIG. 13 is a flow chart illustrating a method for making an electroacoustic device according to an exemplary embodiment.

FIG. 13 is a flow chart illustrating a method 1300 for making an electroacoustic device according to an exemplary embodiment. With reference to FIGS. 12 and 13, in step 1302, a first nanofilm is formed on the PCBA 1220 and a second nanofilm is formed on the diaphragm 1230. In step 1304, the PCBA 1220, the driving unit 1210, the diaphragm 1230, and other elements are assembled to form an electroacoustic device.

Figure 14:
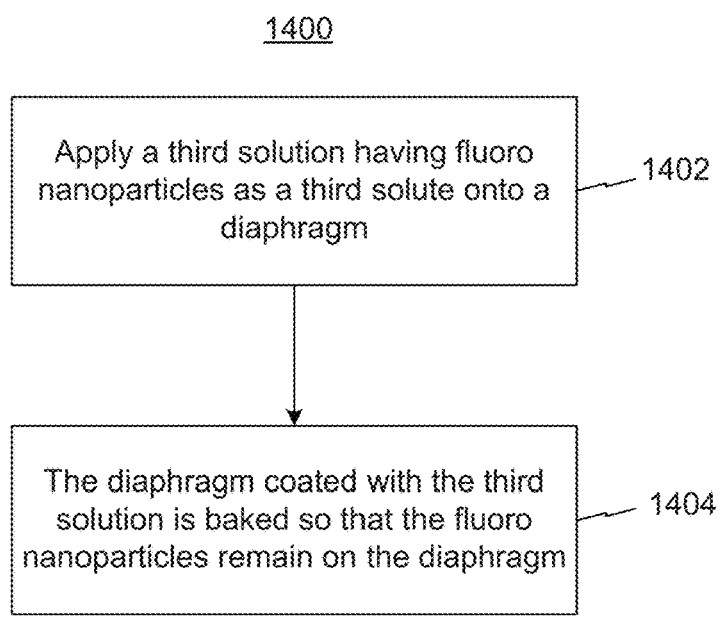
FIG. 14 is a flow chart illustrating a method for forming a second nanofilm on a diaphragm according to an exemplary embodiment.

FIG. 14 is a flow chart illustrating a method 1400 for forming the second nanofilm on the diaphragm 1230. In step 1402, the diaphragm 1230 is placed in an automatic dipping machine for applying a third solution having fluoro nanoparticles as a third solute on the diaphragm 1230. In some embodiments, the diaphragm 1230 may be spayed or brushed or processed by other known ways for applying the third solution thereon. The concentration of the third solution may be from 3% to 20%. In step 1404, the diaphragm 1230 coated with the third solution is baked so that the fluoro nanoparticles remains on the diaphragm by at least one of volatilization and pyrolysis of a third solvent of the third solution. For example, the diaphragm with the third solution may be baked at about 60 degree to 200 degree Celsius for 10-120 minutes in a baking equipment (not shown). The third solvent has a composition including a major solvent and a minor solvent. The major solvent is one of water, or ethanol, and the minor solvent is ethylene glycol.

The dustproof mesh 1240 may be made of a fibrous material such as an artificial fiber-like material or leather for preventing foreign objects from going into the diaphragm. The dustproof mesh 1240 may also be coated with a nanofilm. A method of coating a nanofilm onto the dustproof mesh 1240 similar to that for coating the diaphragm 1230. An exemplary method for coating the dustproof mesh 1240 is described as follows. The dustproof mesh 1240 is placed on a loader (not shown) for facilitating processing in later steps. The dustproof mesh 1240 is placed in automatic dipping machine for applying a fourth solution with fluoro nanoparticles as a fourth solute on the dustproof mesh 1240.

In some embodiments, the dustproof mesh 1240 may be spayed or brushed or coated with other ways for applying the fourth solution thereon. The concentration of the fourth solution is from 3% to 20%. The dustproof mesh 1240 coated with the fourth solution is baked so that the fluoro nanoparticles remain on the dustproof mesh 1240 by at least one of volatilization and pyrolysis of a fourth solvent of the fourth solution. For example, the dustproof mesh 1240 coated with the fourth solution is baked at about 60 degree to 200 degree Celsius for 10-120 minutes in a baking equipment (not shown). The fourth solvent has a composition including a major solvent and a minor solvent. The major solvent is one of water or ethanol, and the minor solvent is ethylene glycol. In some embodiments, the fourth solution is same as the third solution.

Figure 15A:
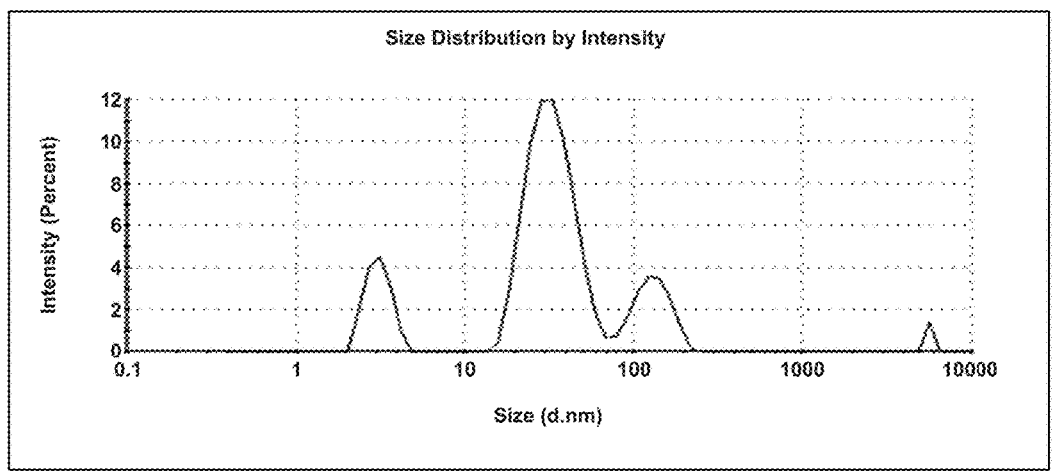
FIG. 15A-15C show three measurement results of particle size distribution of $TiO_2$ nanoparticles by a dynamic light scattering method according to an exemplary embodiment.
Figure 15B:
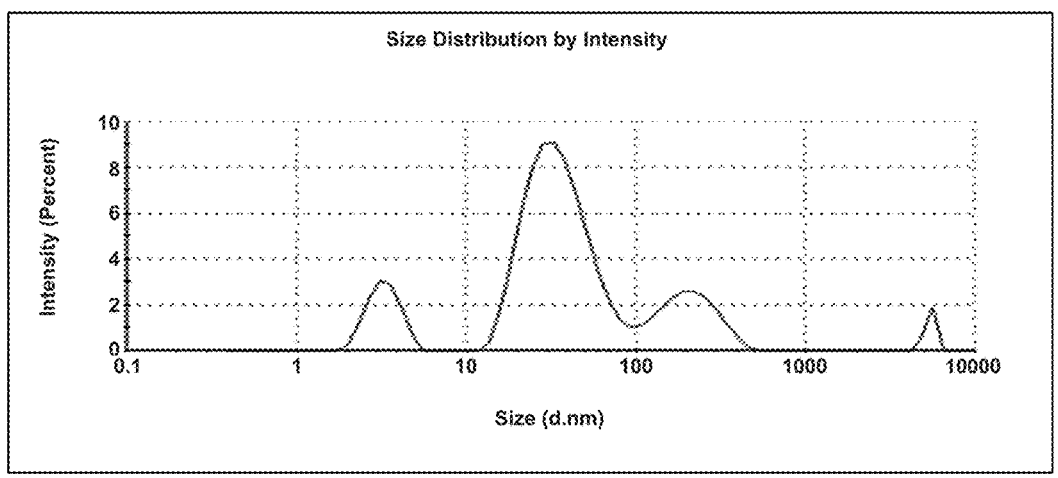
Figure 15C:
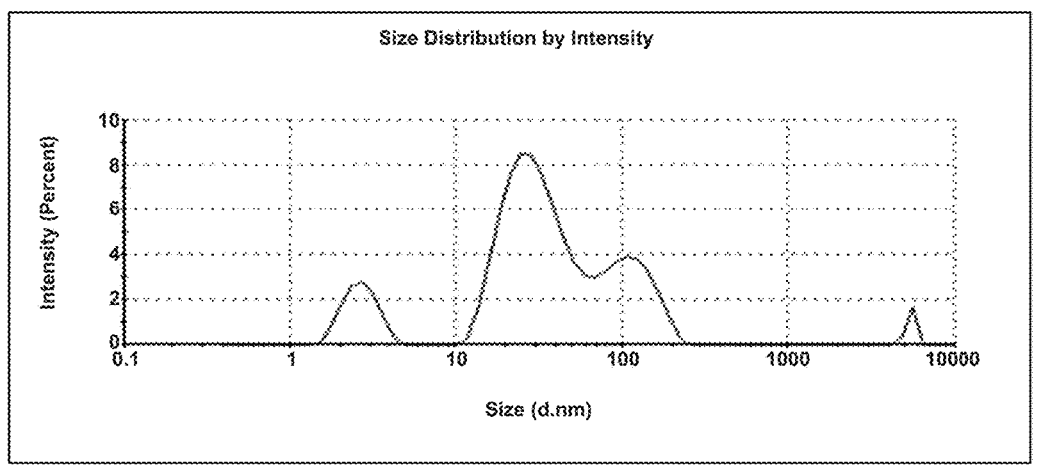

In some embodiments, the first nanofilm may include $TiO_2$ nanoparticles; the second nanofilm may include $SiO_2$ nanoparticles; and the third nanofilm may include a fluoropolymer. Test results of the particle sizes are shown in the following figures. FIG. 15A-15C show three measurement results of particle size distribution of $TiO_2$ nanoparticles by a dynamic light scattering (DLS) method. The majority of particle size (diameter) of $TiO_2$ nanoparticles is in the range of from about 32 nm to 36 nm. A second highest particle-size peak is located at about 110 nm to 220 nm.

Figure 16:
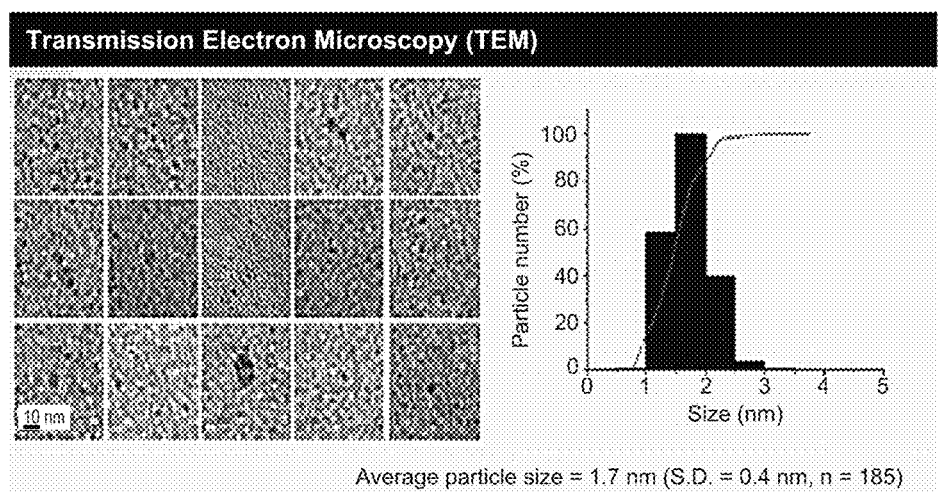
FIG. 16 shows transmission electron microscopy (TEM) images of $SiO_2$ nanoparticles and a particle size distribution diagram, according to an exemplary embodiment.
Figure 17:
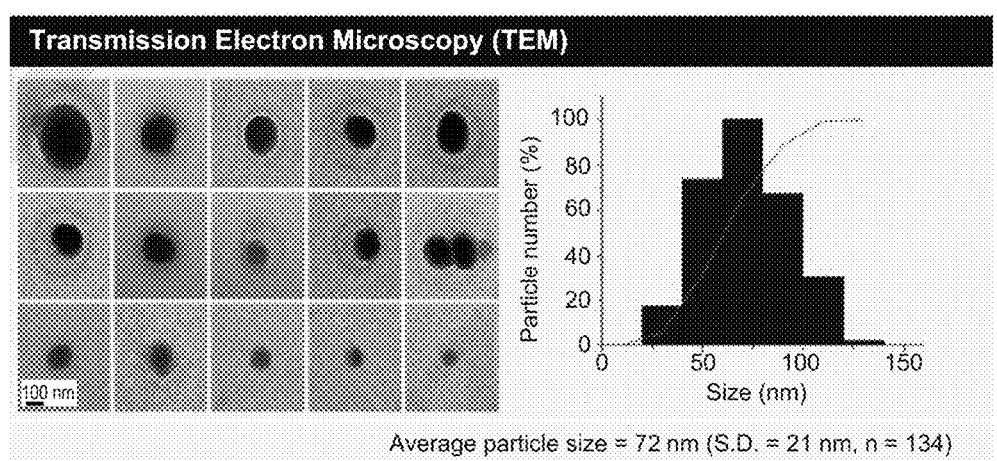
FIG. 17 shows TEM images of fluoropolymer nanoparticles and a particle size distribution diagram, according to an exemplary embodiment.

FIG. 16 shows transmission electron microscopy (TEM) images of $SiO_2$ nanoparticles and a particle size distribution diagram. The particle size (diameter) of the $SiO_2$ nanoparticle is in the range from 1 nm to 2.5 nm (average size 1.7 nm±0.4 nm). FIG. 17 shows TEM images of fluoropolymer nanoparticles and a particle size distribution diagram. The particle size (diameter) of the fluoropolymer is in the range from 50 nm to 100 nm (average size 72 nm±21 nm). The fluoropolymer can be perfluoroether, or perfluoroether-modified siloxane.

To understand whether the nanofilm affects the acoustic quality of an electroacoustic device or not, the inventor conducted tests measuring the frequency response (FR) and the total harmonic distortion (THD) of the electroacoustic device before and after a device is coated with nanofilm. In the test, two electroacoustic devices are employed for comparing their acoustic quality. Each of the electroacoustic devices has at least a PCBA, a diaphragm, and a dustproof mesh. One of the electroacoustic devices includes no components coated with the nanofilm. The other includes a PCBA coated with the first nanofilm, a diaphragm coated with the second nanofilm, and a dustproof mesh coated with the third nanofilm.

The testing steps are described as follows. A water droplet is dropped into each of the dustproof meshes. The meshes are inspected to determine whether they are moistened or not. The electroacoustic devices are then activated to play sounds. The performance of the electroacoustic devices is measured and compared in the FR test and the THD test. The testing results are shown in Table 7 below, which confirm that the nanofilm does not affect the acoustic quality of the electroacoustic device significantly.

Figure 18:
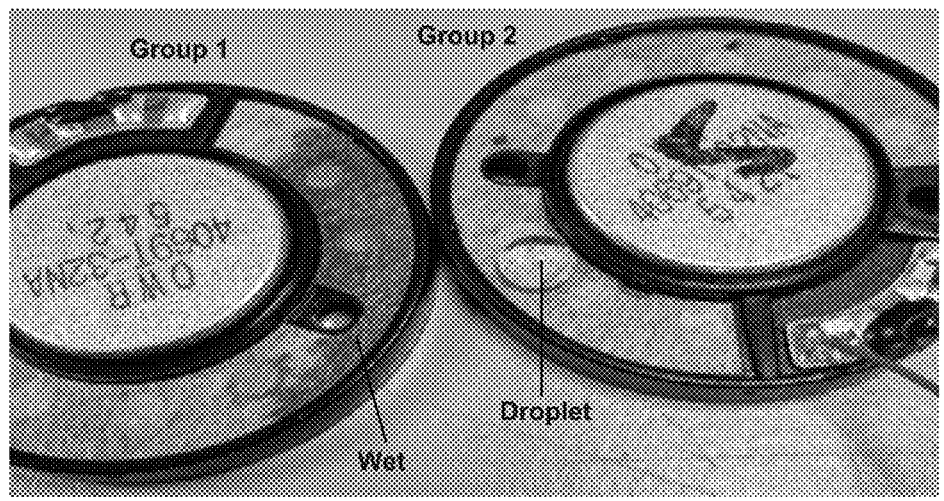
FIG. 18 is an image showing two dustproof meshes with (on the right) and without (on the left) a nanofilm, to which the water droplets are applied, according to an exemplary embodiment.

FIG. 18 is an image showing two dustproof meshes with (on the right) and without (on the left) the third nanofilm, to which the water droplets are applied. In the group 1, the dustproof mesh without the third nanofilm is moistened. In the group 2, the dustproof mesh with the third nanofilm is still dry and the water droplet is seen in the image.

Figure 19:
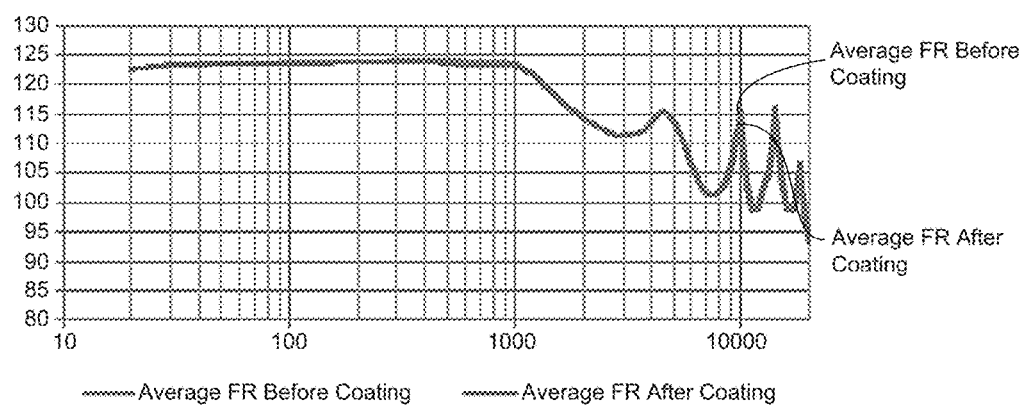
FIG. 19 shows average frequency response (FR) of electroacoustic devices before and after being coated with a nanofilm and after a water drop testing, according to an exemplary embodiment.
Figure 20:
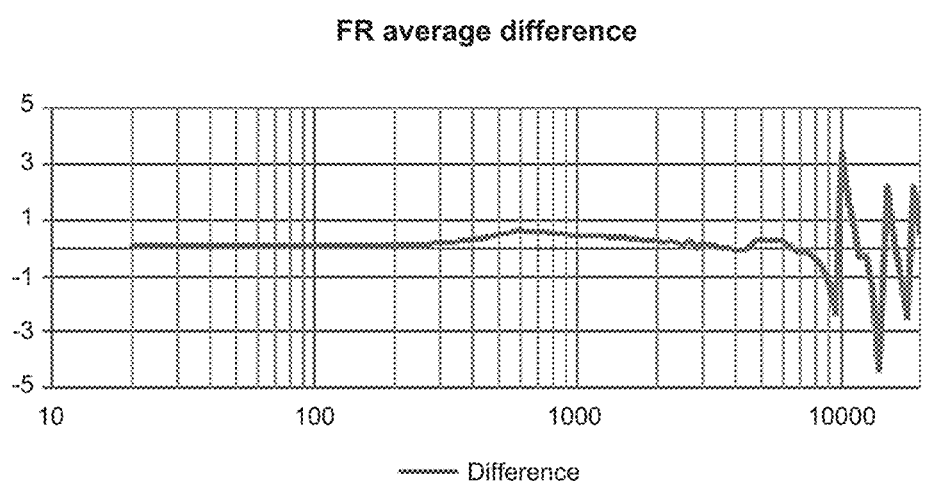
FIG. 20 shows differences of average FR of electroacoustic devices before and after being coated with a nanofilm and after a water drop testing, according to an exemplary embodiment.

FIG. 19 shows average frequency response (FR) of the electroacoustic devices before and after being coated with the nanofilm and after the water drop testing. FIG. 20 shows the difference of the average frequency response (FR) of the electroacoustic devices being coated with the nanofilm and after the water drop testing. The test results confirms that the nanofilm does not affect the average FR. The maximum variation is about 2~4 dB at a high frequency (10K~14 KHz).

Figure 21:
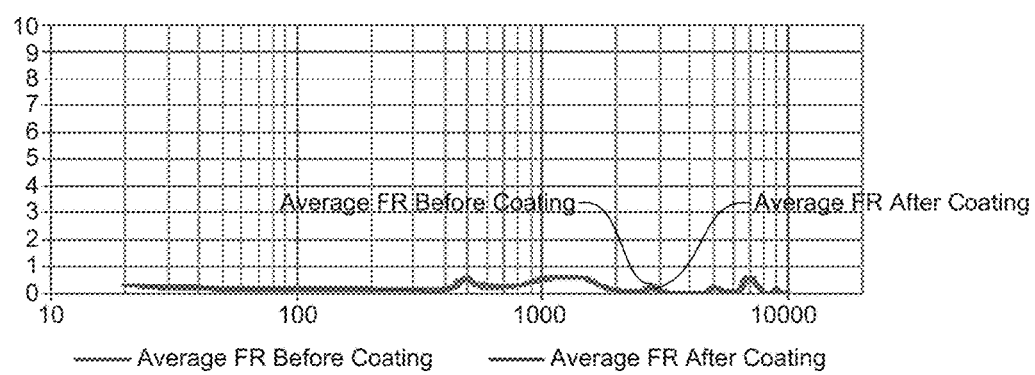
FIG. 21 shows average total harmonic distortion (THD) of electroacoustic devices before and after being coated with a nanofilm and after a water drop testing, according to an exemplary embodiment.
Figure 22:
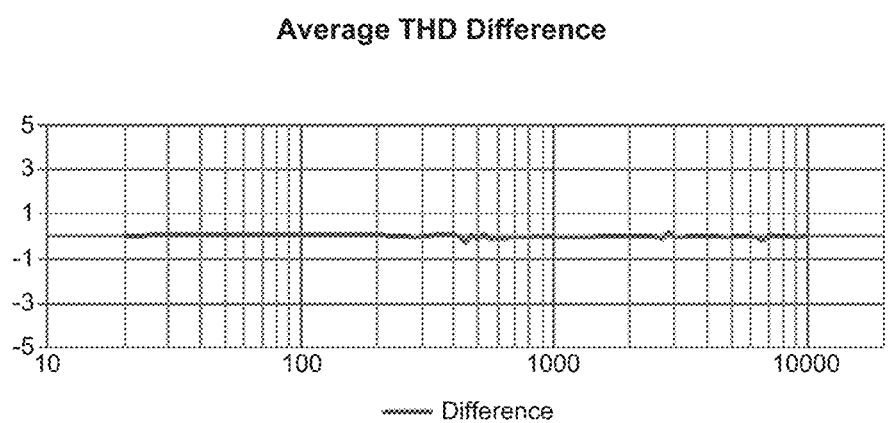
FIG. 22 shows differences of average THD of electroacoustic devices before and after being coated with a nanofilm and after a water drop testing, according to an exemplary embodiment.

FIG. 21 shows average total harmonic distortion (THD) of the electroacoustic device before and after being coated with the nanofilm and after the water drop testing. FIG. 22 shows the difference of the average THD of the electroacoustic device before and after being coated with the nanofilm and after the water drop testing. The test results confirms that the nanofilm does not affect the average THD. The average THD are consistent and the maximum variation is about 0.2%.

TABLE 7

|  | Visual Inspection | Acoustic Test |
| --- | --- | --- |
| Group 1 (before being coated with nanofilm) | dustproof mesh is wet | Acoustic performance seriously degraded |
| Group 2 (after being coated with nanofilm) | water droplet remains, dustproof mesh is dry | FR curve deviation < 4 dB THD curve deviation < 0.2% |

Other embodiments of the invention will be apparent to those skilled in the art from consideration of the specification and practice of the invention disclosed here. This application is intended to cover any variations, uses, or adaptations of the invention following the general principles thereof and including such departures from the present disclosure as come within known or customary practice in the art. It is intended that the specification and examples be considered as exemplary only, with a true scope and spirit of the invention being indicated by the following claims.

It will be appreciated that the present invention is not limited to the exact construction that has been described above and illustrated in the accompanying drawings, and that various modifications and changes can be made without departing from the scope thereof. It is intended that the scope of the invention only be limited by the appended claims.

What is claimed is:

1. A device, comprising:
a printed circuit board assembly including:
a printed circuit board; and
one or more electronic components disposed on the printed circuit board; and
a nanofilm disposed on the printed circuit board assembly, the nanofilm including:
an inner coating in contact with the printed circuit board assembly, the inner coating including metal oxide nanoparticles having a particle diameter in a range of 5 nm to 100 nm; and
an outer coating in contact with the inner coating, the outer coating including silicon dioxide nanoparticles having a particle diameter in a range of 0.1 nm to 10 nm.

2. The device of claim 1, wherein one or more portions of the printed circuit board assembly are exposed from and are free of the nanofilm.

3. The device of claim 1, wherein one or more portions of the printed circuit board assembly are exposed from the outer coating.

4. The device of claim 1, wherein the printed circuit board assembly includes pores and gaps, wherein the nanofilm is disposed in the pores and gaps.

5. The device of claim 1, wherein the one or more electronic components includes one of a resistor, a capacitor, an inductor, a transistor, a diode, a connector, a speaker, or a microphone.

6. The device of claim 1, wherein the metal oxide nanoparticles includes an oxide of one or more metals selected from Al, Ga, In, Sn, Tl, Pb, Bi, Sc, Ti, V, Cr, Mn, Fe, Co, Ni, Cu, Zn, Y, Zr, Nb, Mo, Tc, Ru, Rh, Pd, Ag, Cd, Lu, Hf, Ta, W, Re, Os, Ir, Pt, Au, and Hg.

7. The device of claim 1, wherein the inner coating and the outer coating interpenetrate with each other.

8. The device of claim 1, wherein the inner coating includes pores, and the outer coating interpenetrate into the pores of the inner coating so as to interpenetrate with the inner coating.

9. The device of claim 1, wherein the inner coating is made of titanium oxide nanoparticles.

10. A device, comprising:
a printed circuit board assembly including:
a printed circuit board; and
one or more electronic components disposed on the printed circuit board; and
a nanofilm disposed on the printed circuit board assembly, the nanofilm including:
an inner coating in contact with the printed circuit board assembly, the inner coating made of titanium oxide nanoparticles having a particle diameter in a range of 5 nm to 100 nm; and
an outer coating in contact with the inner coating, the outer coating including silicon dioxide nanoparticles having a particle diameter in a range of 0.1 nm to 10 nm,
wherein the inner coating includes pores, and the outer coating interpenetrate into the pores of the inner coating so as to interpenetrate with the inner coating.

11. The device of claim 10, wherein one or more portions of the printed circuit board assembly are exposed from and not coated with the nanofilm.

* * * * *